United States Patent
Fekih-Romdhane et al.

(10) Patent No.: US 8,122,320 B2
(45) Date of Patent: Feb. 21, 2012

(54) INTEGRATED CIRCUIT INCLUDING AN ECC ERROR COUNTER

(75) Inventors: Khaled Fekih-Romdhane, Burlington, VT (US); Peter Chlumecky, Hinesburg, VT (US)

(73) Assignee: Qimonda AG, Munich (DE)

( * ) Notice: Subject to any disclaimer, the term of this patent is extended or adjusted under 35 U.S.C. 154(b) by 1066 days.

(21) Appl. No.: 12/017,607

(22) Filed: Jan. 22, 2008

(65) Prior Publication Data
US 2009/0187809 A1    Jul. 23, 2009

(51) Int. Cl.
*G11C 29/00* (2006.01)

(52) U.S. Cl. .............. 714/763; 714/30; 714/42; 714/48; 714/52; 714/704; 714/764; 714/746; 365/185.09; 365/201

(58) Field of Classification Search .......................... None
See application file for complete search history.

(56) References Cited

U.S. PATENT DOCUMENTS

| | | | | |
|---|---|---|---|---|
| 4,958,352 A * | 9/1990 | Noguchi et al. | ............. | 714/704 |
| 5,233,610 A * | 8/1993 | Nakayama et al. | ............. | 714/704 |
| 5,548,797 A * | 8/1996 | Arimilli et al. | ................. | 710/60 |
| 5,771,247 A * | 6/1998 | Allen et al. | ................... | 714/763 |
| 6,044,479 A | 3/2000 | Dell | | |
| 6,587,986 B1 * | 7/2003 | Kanazawa et al. | ............ | 714/774 |
| RE40,252 E * | 4/2008 | Tanaka | ..................... | 365/185.33 |
| 7,818,651 B2 * | 10/2010 | Nagai et al. | ................... | 714/762 |
| 7,971,124 B2 * | 6/2011 | Spanel et al. | ................. | 714/768 |
| 2004/0193966 A1 * | 9/2004 | Hirabayashi | .................... | 714/54 |
| 2005/0144551 A1 | 6/2005 | Nahas | | |
| 2006/0150062 A1 * | 7/2006 | Huang | ......................... | 714/763 |
| 2006/0184856 A1 * | 8/2006 | Suzuki | ......................... | 714/758 |
| 2007/0089032 A1 * | 4/2007 | Alexander et al. | ........... | 714/763 |
| 2008/0091990 A1 * | 4/2008 | Bruce et al. | .................. | 714/721 |
| 2008/0175078 A1 * | 7/2008 | Lovett et al. | .................. | 365/194 |
| 2009/0077432 A1 * | 3/2009 | Nakamura et al. | ........... | 714/704 |
| 2009/0132876 A1 * | 5/2009 | Freking et al. | ................ | 714/723 |
| 2009/0177932 A1 * | 7/2009 | Abts et al. | .................... | 714/704 |

* cited by examiner

*Primary Examiner* — John Trimmings
(74) *Attorney, Agent, or Firm* — Dicke, Billig & Czaja, PLLC

(57) ABSTRACT

An integrated circuit includes a memory array and an error correction code (ECC) circuit configured to provide a first signal indicating whether data read from the memory array has been corrected by the ECC circuit. The integrated circuit includes a mimic circuit configured to provide a second signal indicating whether the first signal is valid and a counter configured to increment in response to the second signal indicating the first signal is valid and the first signal indicating an error.

20 Claims, 3 Drawing Sheets

INTEGRATED CIRCUIT INCLUDING AN ECC ERROR COUNTER

BACKGROUND

To improve the reliability of random access memories, such as dynamic random access memories (DRAMs), memories may include additional circuitry to correct for single bit failures. The additional circuitry typically implements an error correction code (ECC), such as a Hamming code, where parity bits are generated during memory writes and stored with data bits in the memory. The parity bits are stored in an additional memory area dedicated to storing parity bits. This additional parity memory is not directly accessible by an end user; rather it is used as part of the overall error detection and correction.

ECC calculates parity information and can determine if a bit has switched to an incorrect value. ECC can compare the parity originally calculated to the tested parity and make any corrections to correct for incorrect data values. In some cases, it is desirable to have ECC built directly into a memory chip to provide greater memory chip reliability or to optimize other memory chip properties such as self refresh currents on low power DRAMs. ECC circuitry, however, is typically associated with a large overhead due to additional memory elements used to store the parity information. Typical ECC implementations may cost up to 50% of the memory chip area.

With error correction enabled, single bit failures corrected by the ECC circuitry are invisible to the end user since the memory device provides error free data to the end user. Knowing the number of single bit failures occurring in the background, however, is important for predicting the quality of the overall memory system and for understanding the contribution of the ECC circuitry on the overall memory quality and reliability. A typical memory tester cannot count the "invisible" corrected single bit failures unless the error correction of the memory is disabled, which allows the single bit failures to become visible.

Thus to test a typical memory, the memory is first read with the error correction disabled so that the number of single bit failures can be counted. The memory is then reread with the error correction enabled to test whether the single bit failures are corrected. Therefore for a complete test of the memory, the memory is read twice, which increases test time by more than a factor of two when compared to a non-error correcting memory of the same size. The test time is increased by more than a factor of two since the parity memory is typically treated as an additional separate memory that is tested by reading with the error correction disabled.

For these and other reasons, there is a need for the present invention.

SUMMARY

One embodiment provides an integrated circuit. The integrated circuit includes a memory array and an error correction code (ECC) circuit configured to provide a first signal indicating whether data read from the memory array has been corrected by the ECC circuit. The integrated circuit includes a mimic circuit configured to provide a second signal indicating whether the first signal is valid and a counter configured to increment in response to the second signal indicating the first signal is valid and the first signal indicating an error.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
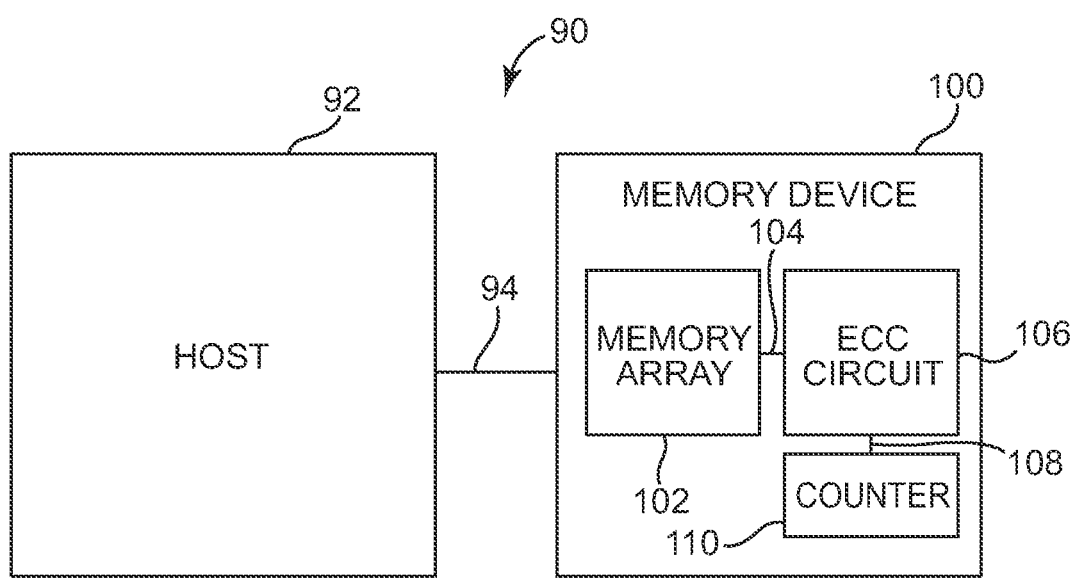
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a dynamic random access memory (DRAM) device or other suitable memory device.

As used herein, the term "electrically coupled" is not meant to mean that the elements must be directly coupled together and intervening elements may be provided between the "electrically coupled" elements.

Memory device 100 includes a memory array 102, an error correction code (ECC) circuit 106, and a counter 110. Memory array 102 is electrically coupled to ECC circuit 106 through signal path 104. ECC circuit 106 is electrically coupled to counter 110 through signal path 108. During testing of memory array 102, error correction is enabled and ECC circuit 106 corrects single bit failures in data read from memory array 102. Counter 110 counts the number of single bit failures in the background while the data is read from memory array 102. In this way, memory array 102 is tested and the number of single bit failures are counted during a single read through of memory array 102. Therefore, the test time for memory device 100 is reduced by at least half compared to a memory device where the memory array is read twice (i.e., once with error correction enabled and once with error correction disabled).

Figure 2:
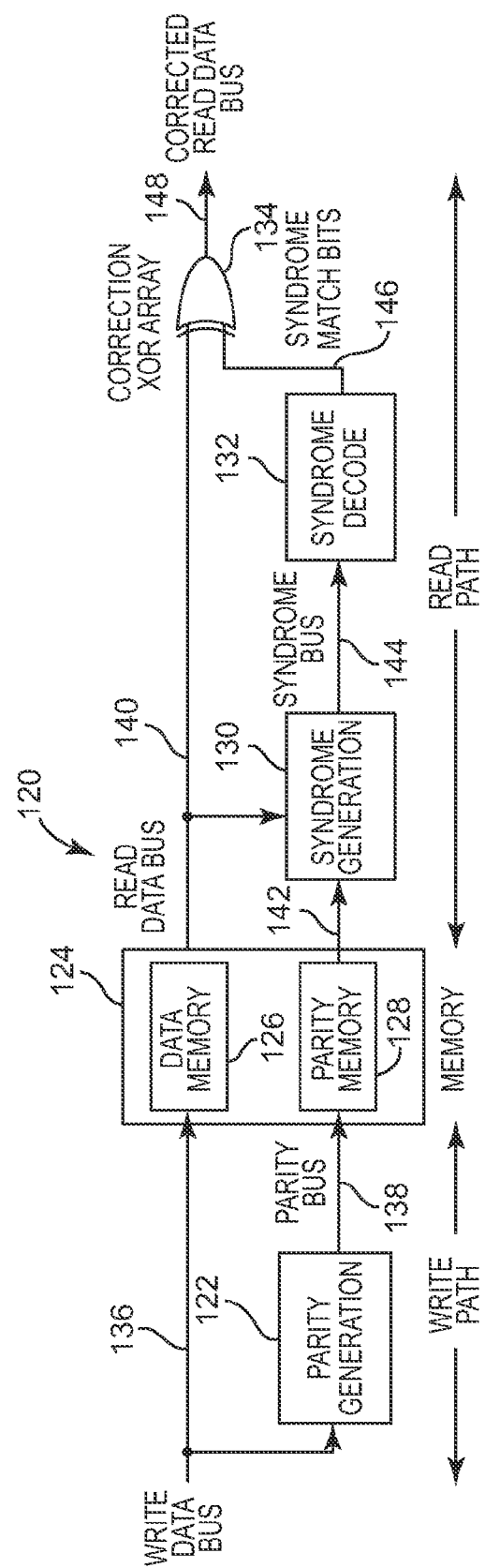
FIG. 2 is a block diagram illustrating one embodiment of a data path in a memory device.

FIG. 2 is a block diagram illustrating one embodiment of a data path 120 in a memory device, such as memory device 100. Data path 120 includes a parity generation circuit 122, a memory 124 including a data memory 126 and a parity memory 128, a syndrome generation circuit 130, a syndrome decode circuit 132, and a correction XOR array 134.

Write data bus 136 is electrically coupled to the input of data memory 124 and the input of parity generation circuit 122. The output of parity generation circuit 122 is electrically coupled to the input of parity memory 128 through parity bus 138. The output of data memory 126 is electrically coupled to a first input of correction XOR array 134 and a first input of syndrome generation circuit 130 through read data bus 140. The output of parity memory 128 is electrically coupled to a second input of syndrome generation circuit 130 through signal path 142. The output of syndrome generation circuit 130 is electrically coupled to the input of syndrome decode circuit 132 through syndrome bus 144. The output of syndrome decode circuit 132 is electrically coupled to a second input of correction XOR array 134 through syndrome match bits signal path 146. The output of correction XOR array 134 is electrically coupled to the corrected read data bus 148.

In the write data path, parity generation circuit 122 receives data to write to memory 124 through write data bus 136 to provide parity bits on parity bus 138. In one embodiment, parity generation circuit 122 uses a Hamming code to generate the parity bits for the write data on write data bus 136. Data memory 126 receives data to be written to memory 126 through write data bus 136 and stores the write data in memory 126. Parity memory 128 receives the parity bits for the write data through parity bus 138 and stores the parity bits in parity memory 128.

In the read data path, memory 126 provides read data on read data bus 140 and parity memory 128 provides the associated parity bits for the read data on signal path 142. Syndrome generation circuit 130 receives the read data through read data bus 140 and the associated parity bits for the read data through signal path 142 and generates a syndrome based on the read data and the associated parity bits. Syndrome generation circuit 130 provides the syndrome on syndrome bus 144.

Syndrome decode circuit 132 receives the syndrome through syndrome bus 144 and decodes the syndrome to determine whether a single bit failure has occurred. Syndrome decode circuit 132 provides syndrome match bits on syndrome match bits signal path 146. Each read data bit on read data bus 140 has a corresponding match bit on syndrome match bits signal path 146. If the read data bit is correct, the corresponding syndrome match bit is logic low. If the read data bit is incorrect, the corresponding syndrome match bit is logic high.

Correction XOR array 134 receives the read data through read data bus 140 and the corresponding syndrome match bits through syndrome match bits signal path 146 to provide corrected read data on corrected read data bus 148. Correction XOR array 134 XOR's each data memory bit on read data bus 140 with its corresponding syndrome match bit on syndrome match bits signal path 146 to determine what value is output to corrected read data bus 148. Thus, if a syndrome is generated that is decoded such that a single bit failure is found to exist, the corresponding read data bit is inverted by correction XOR array 134.

During a write operation, parity bits are generated by parity generation circuit 122 for data on write data bus 136 to be written to memory 124. Both the data and the corresponding parity bits are written to memory 124. During a read operation, memory 124 provides the read data and the corresponding parity bits. Syndrome generation circuit 130 generates a syndrome based on the read data and the corresponding parity bits. Syndrome decode circuit 132 then decodes the syndrome to provide syndrome match bits. Correction XOR array 134 XOR's the read data with the corresponding syndrome match bits to correct any single bit failures. Correction XOR array 134 provides the corrected read data on corrected read data bus 148.

Figure 3:
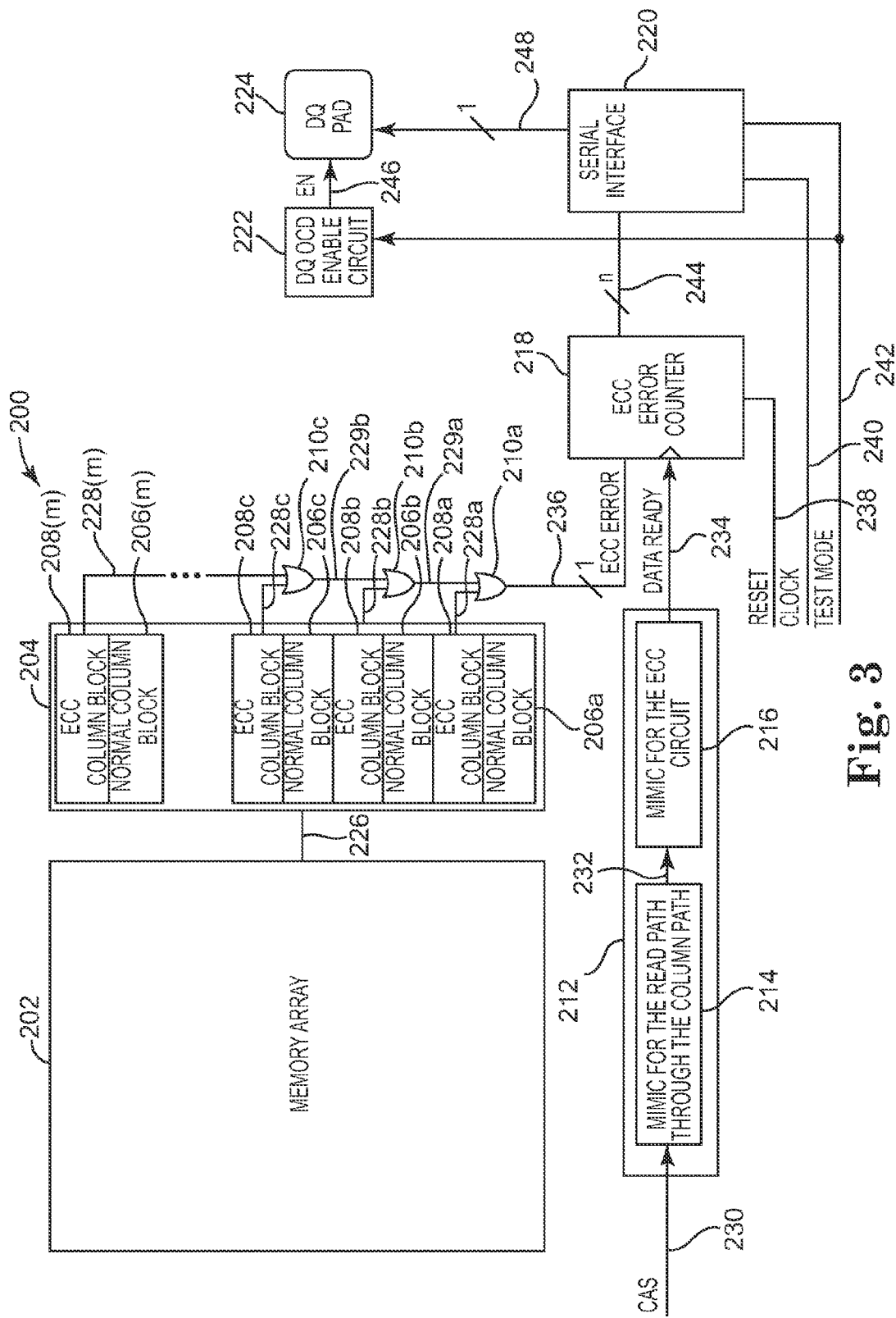
FIG. 3 is a block diagram illustrating one embodiment of a portion of a memory device for counting single bit failures.

FIG. 3 is a block diagram illustrating one embodiment of a portion 200 of a memory device, such as memory device 100 for counting single bit failures. Portion 200 includes a memory array 202, an ECC circuit 204, OR gates 210a-210c, a mimic circuit 212, an ECC error counter 218, a serial interface 220, a data pad or pin (DQ) off chip driver (OCD) enable circuit 222, and a DQ pad or pin 224. ECC circuit 204 includes normal column blocks 206a-206(m) and ECC column blocks 208a-208(m), where "m" indicates the number of column blocks for memory array 202. Mimic circuit 212 includes a mimic circuit 214 to mimic the delay through the read path through the column path of memory array 202 and a mimic circuit 216 to mimic the delay through ECC circuit 204.

Memory array 202 is electrically coupled to ECC circuit 204 through signal path 226. The output of each ECC column block 208a-208(m) is electrically coupled to an input of an OR gate 210a-210c. The output of ECC column block 208a is electrically coupled to a first input of OR gate 210a through signal path 228a. The output of ECC column block 208b is electrically coupled to a first input of OR gate 210b through signal path 228b. The output of ECC column block 208c is electrically coupled to a first input of OR gate 210c through signal path 228c.

The output of ECC column block 208(m) is electrically coupled to a second input of an OR gate through signal path 228(m) (e.g., the second input of OR gate 210c). The output of OR gate 210c is electrically coupled to a second input of OR gate 210b through signal path 229b. The output of OR gate 210b is electrically coupled to a second input of OR gate 210a through signal path 229a. The output of OR gate 210a is electrically coupled to an input of ECC error counter 218 through ECC error signal path 236.

The input of mimic circuit 214 receives a column address strobe (CAS) signal on CAS signal path 230. The output of mimic circuit 214 is electrically coupled to the input of mimic circuit 216 through signal path 232. The output of mimic circuit 216 is electrically coupled to the clock input of ECC error counter 218 through data ready signal path 234. The reset input of ECC error counter 218 receives a reset signal through reset signal path 238.

The output of ECC error counter 218 is electrically coupled to a first input of serial interface 220 through signal path 244. A second input of serial interface 220 receives a clock signal through clock signal path 240. A third input of serial interface 220 and the input of DQ OCD enable circuit 222 receive a test mode signal on test mode signal path 242. The output of serial interface 220 is electrically coupled to an input of DQ pad 224 through signal path 248. The output of DQ OCD enable circuit 222 is electrically coupled to the enable input of DQ pad 224 through enable (EN) signal path 246.

Memory array 202 includes data memory and parity memory. During a read operation, memory array 202 provides read data and the corresponding parity bits to ECC circuit 204 through signal path 226 in response to a CAS signal. ECC circuit 204 receives the read data and the corresponding parity bits and detects and corrects single bit failures. Single bit failures are detected and corrected by generating syndromes and decoding the syndromes to provide syndrome match bits as previously described and illustrated with reference to FIG. 2.

ECC circuit 204 is divided into normal column blocks 206a-206(m) and ECC column blocks 208a-208(m) for detecting and correcting single bit failures within column blocks of memory array 202. In response to not detecting a single bit failure within a column block, the corresponding ECC column block 208a-208(m) provides a logic low signal on the corresponding signal path 228a-228(m). In response to detecting and correcting a single bit failure within a column block, the corresponding ECC column block 208a-208(m) provides a logic high signal on the corresponding signal path 228a-228(m).

OR gates 210a-210c receive the signals on signal paths 228a-228(m) and OR all the signals to provide an ECC error bit on ECC error signal path 236. In response to all ECC column blocks 208a-208(m) providing logic low signals on corresponding signal paths 228a-228(m), OR gate 210a provides a logic low ECC error bit indicating no single bit failures were detected. In response to any one of ECC column blocks 208a-208(m) providing a logic high signal on a corresponding signal path 228a-228(m), OR gate 210a provides a logic high ECC error bit indicating a single bit failure was detected.

Mimic circuit 214 receives the CAS signal on CAS signal path 230 to provide a signal on signal path 232. The CAS signal is asserted to read data from memory array 202 during a read operation. Mimic circuit 214 provides a delay equivalent to a time for data read from memory array 202 to pass through the read path through the column path of memory array 202. Mimic circuit 216 receives the signal on signal path 232 to provide the data ready signal on data ready signal path 234. Mimic circuit 216 provides a delay equivalent to a time for ECC circuit 204 to detect and correct errors within the data read from memory array 202. Mimic circuits 214 and 216 delay the CAS signal to provide the data ready signal indicating when the ECC error bit on ECC error signal path 236 is valid.

ECC error counter 218 receives the ECC error bit on ECC error signal path 236, the data ready signal on data ready signal path 234, and the reset signal on reset signal path 238 to provide a count on signal path 244. In response to a logic high reset signal, the count of ECC error counter 218 is reset to zero. In another embodiment, the count of ECC error counter 218 is reset in response to a logic low reset signal. In response to a logic low data ready signal, the count of ECC error counter 218 does not increment. In response to a logic high data ready signal and a logic low ECC error signal, the count of ECC error counter 218 does not increment. In response to a logic high data ready signal and a logic high ECC error signal, the count of ECC error counter 218 increments by one. The individual bits that provide the count of ECC error counter 218 are output in parallel on signal path 244 and include "n" bits, where "n" is a suitable number of bits for ensuring that ECC error counter 218 does not overflow. The value of "n" is based on the size of memory array 202 and the expected number of single bit failures.

Serial interface 220 receives the count of ECC error counter 218 through signal path 244, the clock signal through clock signal path 240, and the test mode signal through test mode signal path 242 to provide a signal on signal path 248. In response to a logic high test mode signal, serial interface 220 serially outputs the count of ECC error counter 218 on signal path 248 in response to the clock signal. In another embodiment, serial interface 220 serially outputs the count of ECC error counter 218 on signal path 248 in response to the clock signal and a logic low test mode signal.

DQ OCD enable circuit 222 receives the test mode signal through test mode signal path 242 to provide the enable signal on enable signal path 246. In response to a logic high test mode signal, DQ OCD enable circuit 222 provides a logic high enable signal. In response to logic low test mode signal, DQ OCD enable circuit 222 provides a logic low enable signal. In another embodiment, the logic levels of the test mode signal and/or the enable signal are reversed.

DQ pad 224 receives the enable signal on enable signal path 246 and the signal on signal path 248. In response to a logic high enable signal, DQ pad 224 is enabled and provides the signal on signal path 248 to an external circuit, such as memory test equipment. In response to a logic low enable signal, DQ pad 224 is disabled. In another embodiment, the logic levels of the enable signal are reversed.

Memory test equipment (not shown) tests memory array 202 by reading data written to memory array 202 to detect failures. Any assertion of a syndrome match bit in ECC circuit 204 indicates that a single bit failure has occurred. The syndrome match bits are OR'd together by OR gates 210a-210c to generate a single ECC error bit. The ECC error bit is asserted any time there is a single bit failure following a read access to memory array 202. The ECC error bit is set at the time the data read from memory array 202 is valid. ECC error counter 218 is triggered by the data ready signal to make sure the ECC error bit is counted only once when the read data is ready and processed by ECC circuit 204. The data ready signal is generated in the periphery of memory array 202 by taking the CAS signal and driving the CAS signal through mimic circuit 212 to reproduce the delay through memory array 202 and ECC circuit 204.

Throughout a test sequence, ECC error counter 218 counts the single bit failures indicated by the ECC error bit. ECC error counter 218 is reset once the entire memory array 202 is read since looping through memory array 202 more than once will cause ECC error counter 218 to count the same failures twice and possibly overflow. After the test sequence is finished, the test equipment issues a test mode command. The test mode command triggers the readout of the count of ECC error counter 218 to DQ pad 224 through serial interface 220. The time to readout the number of single bit failures is a multiple of the clock cycle of the clock signal on clock signal path 240 and the number of bits of ECC error counter 218 on signal path 244. The time to readout the number of single bit failures is negligible compared to the time to perform a complete test sequence of memory array 202 with ECC circuit 204 disabled.

Embodiments provide a memory device including ECC circuitry and a counter to count single bit failures in the background during a test sequence of the memory device. By counting single bit failures in the background, the memory device can be tested in a single pass with the ECC circuitry enabled instead of in two passes as required by typical memory devices with ECC circuitry.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a memory array;
an error correction code (ECC) circuit configured to provide a first signal indicating whether data read from the memory array has been corrected by the ECC circuit;
a mimic circuit configured to provide a second signal indicating whether the first signal is valid;
a counter configured to increment in response to the second signal indicating the first signal is valid and the first signal indicating an error; and
an interface configured to output a count of the counter in response to a third signal and a clock signal.

2. The integrated circuit of claim 1, further comprising:
a data pad or pin configured to receive the output count from the interface.

3. An integrated circuit comprising:
a memory array;
an error correction code (ECC) circuit configured to provide a first signal indicating whether data read from the memory array has been corrected by the ECC circuit;
a mimic circuit configured to provide a second signal indicating whether the first signal is valid; and
a counter configured to increment in response to the second signal indicating the first signal is valid and the first signal indicating an error,
wherein the mimic circuit provides a first delay equivalent to a first time to read data from the memory array plus a second delay equivalent to a second time for the ECC circuit to provide the first signal.

4. The integrated circuit of claim 3, wherein the memory array comprises a dynamic random access memory (DRAM) array.

5. The integrated circuit of claim 3, further comprising:
OR gates for combining error signals from a plurality of ECC column blocks within the ECC circuit to provide the first signal.

6. A system comprising:
a host; and
a memory device communicatively coupled to the host, the memory device comprising:
a memory array;
an error correction code (ECC) circuit configured to provide a first signal in response to detecting an error in data read from the memory array in response to a column address strobe (CAS) signal;
a mimic circuit configured to delay the CAS signal to provide a second signal indicating whether the first signal is valid; and
a counter configured to increment in response to the second signal indicating the first signal is valid and the first signal indicating an error.

7. The system of claim 6, wherein the memory device further comprises:
a serial interface configured to serially output a count of the counter in response, to a test mode signal and a clock signal.

8. The system of claim 7, wherein the memory device further comprises:
a data pad or pin configured to receive the count from the serial interface.

9. The system of claim 7, wherein the memory device further comprises:
an off chip driver enable circuit configured to enable the data pad or pin in response to the test mode signal.

10. The system of claim 6, wherein the mimic circuit provides a first delay equivalent to a first time to read data from the memory array plus a second delay equivalent to a second time for detecting an error in the data read from the memory array.

11. A method for testing a memory, the method comprising:
reading data from a memory array in response to a first signal;
checking the read data for an error;
providing a second signal in response to detecting an error in the read data;
delaying the first signal to provide a third signal indicating whether the second signal is valid; and
incrementing a counter in response to the third signal and the second signal.

12. The method of claim 11, wherein checking the read data for an error comprises checking the read data for a single bit failure.

13. The method of claim 11, further comprising:
outputting a count of the counter in response to a fourth signal.

14. The method of claim 13, wherein outputting the count comprises serially outputting the count in response to the fourth signal and a clock signal.

15. The method of claim 13, wherein outputting the count comprises outputting the count on a data pad or pin.

16. A method for testing a memory, the method comprising:
reading data from a memory array in response to a CAS signal;
checking the read data for an error;
providing an error signal in response to detecting an error in the read data;
correcting the read data in response to detecting the error;
delaying the CAS signal by a first delay equivalent to a first time for reading the data from the memory array and by a second delay equivalent to a second time for checking the read data for an error to provide a data ready signal indicating whether the error signal is valid; and
incrementing a counter in response to the data ready signal and the error signal.

17. The method of claim 16, further comprising:
serially outputting a count of the counter on a data pad or pin in response to a test mode signal and a clock signal.

18. The method of claim 16, wherein reading data from the memory array comprises reading data from a dynamic random access memory (DRAM) array.

19. The method of claim 16, wherein checking the read data for an error comprises checking the read data for a parity error.

20. The method of claim 16, wherein checking the read data for an error comprises checking the read data for a single bit failure.

* * * * *